United States Patent
Hsia et al.

[19]

[11] Patent Number: 5,843,822
[45] Date of Patent: Dec. 1, 1998

[54] DOUBLE-SIDE CORRUGATED CYLINDRICAL CAPACITOR STRUCTURE OF HIGH DENSITY DRAMS

[75] Inventors: Liang-Choo Hsia, Taipei; Thomas Chang, Taichang, both of Taiwan

[73] Assignee: Mosel Vitelic Inc., Hsinchu, Taiwan

[21] Appl. No.: 796,023

[22] Filed: Feb. 5, 1997

[51] Int. Cl.⁶ .............................................. H01L 21/8242
[52] U.S. Cl. ......................................................... 438/254
[58] Field of Search ................................... 438/238, 239, 438/253–256, 381, 396–399

[56] References Cited

U.S. PATENT DOCUMENTS

| | | | |
|---|---|---|---|
| 5,021,357 | 6/1991 | Taguchi et al. | 438/253 |
| 5,185,282 | 2/1993 | Lee et al. | 438/253 |
| 5,384,276 | 1/1995 | Ogawa et al. | 438/254 |
| 5,637,523 | 6/1997 | Fazan et al. | 438/254 |
| 5,656,536 | 8/1997 | Wu | 438/254 |

OTHER PUBLICATIONS

H. Watanabe et al., "A new cylindrical capacitor using hemispherical grained Si (HSG–Si) for 256 Mb DRAMs", IEDM 92, pp. 259–262, 1992.

Primary Examiner—John Niebling
Assistant Examiner—Joni Y. Chang
Attorney, Agent, or Firm—Bacon & Thomas, PLLC

[57] ABSTRACT

A method of fabricating double-side corrugated cylindrical capacitor of high density Dynamic Random Access Memory (DRAM) cells. The corrugated capacitor shape is achieved by depositing the thermal chemical vapor deposition (CVD) oxide and the plasma-enhanced CVD (PECVD) oxide alternating layers. Then, the thermal CVD oxide and the PECVD oxide layers are vertically etched to form two trenches followed by laterally etched by hydrofluoric acid (HF). Because hydrofluoric acid (HF) etches the thermal CVD oxide at a slower rate than etches the PECVD oxide, a cavity is formed in each PECVD oxide layer along the trenches. Finally, polysilicon layer is deposited filling into the trenches. Therefore, the double-side corrugated shape capacitor surface is created that increases the surface area of the capacitor considerably. The cylindrical capacitor storage node of the DRAM capacitor of this method has much greater surface area so as to increase the capacitance value of the DRAM capacitor, that can achieve high packing density of the integrated circuit devices.

22 Claims, 10 Drawing Sheets

DOUBLE-SIDE CORRUGATED CYLINDRICAL CAPACITOR STRUCTURE OF HIGH DENSITY DRAMS

BACKGROUND OF THE INVENTION

(1) Field of the Invention

The present invention relates to a method of fabricating the capacitors of dynamic random access memory (DRAM) cells, and more particularly to the double-side corrugated cylindrical capacitor structure of high density DRAMs.

(2) Description of the Related Art

A DRAM cell comprises a metal-oxide-semiconductor field effect transistor (MOSFET) and capacitors which are built in a semiconductor silicon substrate. There is an electrical contact between the source of a MOSFET and the storage node of the adjacent capacitor, forming a memory cell of the DRAM device. A large number of memory cells make up the cell arrays which combine with the peripheral circuit to produce DRAMs.

In recent years, the sizes of the MOSFETs and capacitors have become continuously smaller so that the packing densities of these DRAM devices have increased considerable. For example, a number of semiconductor manufacturing companies in the world have already begun mass production of 16M bit or even 64M bit DRAMs.

As the sizes of the capacitors become smaller, so as the capacitance values of the capacitors are decreasing, that reduces the signal to noise ratio of the DRAM circuits, causing the performance problem. The issue of maintaining or even increasing the surface area of the storage nodes or reducing the thickness of the dielectric layer is particularly important as the density of the DRAM arrays continues to increase for future generations of memory devices.

When the capacitor is used to fabricate 16 Mbit DRAMs and beyond, increasing the capacitor surface area becomes a top priority. Various shapes of capacitor structures have been used to address this issue. U.S. Pat. No. 5,185,282 to Lee et al. (the entire disclosure of which is herein incorporated by reference) provides a method of fabricating cup-shaped capacitor storage node. Another U.S. Pat. No. 5,021,357 to Taguchi et al. (the entire disclosure of which is herein incorporated by reference) supplies a method of fabricating fin structure capacitor electrode. These capacitor structures can effectively increase the capacitance values of the capacitors, however these processes are too complicated and highly fastidious. They are difficult to be practically employed for mass-production.

Most recently, H. Watanabe et al. in the paper "A new cylindrical capacitor using hemispherical grained Si (HSG-Si) for 256 Mb DRAMs" IEDM 92, pp. 259–262 (the entire disclosure of which is herein incorporated by reference) discloses a method of fabricating cylindrical capacitor electrode. The cylindrical capacitor structure increases the capacitor surface area tremendously without increasing the silicon area. The cylindrical capacitor structure is also more stable than the fin capacitor structure.

The present invention discloses a new method to fabricate high-capacitance cylindrical capacitors of high density DRAMs which further increases the capacitor surface area.

SUMMARY OF THE INVENTION

According, it is a primary object of the present invention to provide a method for a DRAM cell with greater capacitance per unit area.

It is another object of the present invention to provide a method of fabricating the stack capacitor structure of the high density DRAMs.

These objects are accomplished by the fabrication process described below.

First, a field oxide layer for isolation is grown on the semiconductor silicon substrate by standard integrated circuit fabrication process. Then, a MOSFET which includes gate oxide, gate electrode and source/drain regions are formed on the semiconductor silicon substrate.

Next, a first dielectric and a second dielectric layers are sequentially deposited. The first dielectric layer is planarized and the first and second dielectric layers are then etched by plasma-etching to expose the source region of the MOSFET in order to form a cell contact window of the DRAM cell.

Next, the first polysilicon layer which is overlaying the second dielectric layer and filling into the cell contact is formed. Then, a nitride dielectric layer is formed for etching stopper. The thermal chemical vapor deposition (CVD) oxide and the plasma-enhanced CVD (PECVD) oxide layers are alternatively formed overlaying the nitride dielectric layer.

Next, the thermal CVD oxide and the PECVD oxide alternating layers are patterned by the conventional lithography and plasma-etching techniques to form two parallel trenches. Then, the thermal CVD oxide and the PECVD oxide layers are laterally etched by hydrofluoric acid (HF). Because hydrofluoric acid (HF) etches the thermal CVD oxide at a slower rate than etches the PECVD oxide, a cavity is formed in each PECVD oxide layer along the trenches. Therefore, the double-side corrugated shape capacitor surface is created, that is the key point of the present invention.

Next, a second polysilicon layer is formed overlaying the thermal CVD oxide/PECVD oxide alternating layers and filling into the trenches. The second polysilicon layer is then vertically anisotropically etched to remove the top portion of second polysilicon which is overlaying the thermal CVD oxide/PECVD oxide alternating layers, therefore the second polysilicon studs are formed in the trenches.

Finally, the thermal CVD oxide/PECVD oxide alternating layer structure, the nitride layer and a portion of the first polysilicon layer are removed. The capacitor storage node structure which consists of the remaining of the first polysilicon layer and the second polysilicon studs is then accomplished.

Since the thermal CVD oxide/PECVD oxide alternating layer structure is corrugated, the second polysilicon studs are also corrugated which increased the surface area of the capacitor considerably.

After the storage node of the DRAM capacitor is completed, the dielectric layer and the polysilicon top plate of the capacitor are formed by standard integrated circuit technologies. Therefore, the double-side corrugated cylindrical capacitor structure of high density DRAM is accomplished.

BRIEF DESCRIPTION OF THE DRAWINGS

The accompanying drawings forming a material part of this description, in which:

FIG. 1 is a cross sectional representation of the DRAM cell after the cell contact window of the MOSFET is formed.

FIG. 2 is a cross sectional representation of the DRAM cell of FIG. 1 after the first polysilicon layer is deposited.

FIG. 3 is a cross sectional representation of the DRAM cell of FIG. 2 after the thermal CVD oxide/PECVD oxide alternating layers are formed.

FIG. 4 is a cross sectional representation of the DRAM cell of FIG. 3 after two parallel trenches along the thermal CVD oxide/PECVD oxide alternating layers are formed.

FIG. 5 is a cross sectional representation of the DRAM cell of FIG. 4 after the thermal CVD oxide/PECVD oxide alternating layer structure is laterally etched by HF acid.

FIG. 6 is a cross sectional representation of the DRAM cell of FIG. 5 after the nitride layer is etched.

FIG. 7 is a cross sectional representation of the DRAM cell of FIG. 6 after the second polysilicon layer is formed.

FIG. 8 is a cross sectional representation of the DRAM cell of FIG. 7 after the second polysilicon layer is anisotropically etched to form second polysilicon studs in the trenches.

FIG. 9 is a cross sectional representation of the DRAM cell after the thermal CVD oxide/PECVD oxide alternating layer structure, the nitride layer and a portion of the first polysilicon layer are removed to complete the double-side corrugated cylindrical capacitor storage node formation.

FIG. 10 is a cross sectional representation of the DRAM cell after the capacitor dielectric layer is formed.

FIG. 11 is a cross sectional representation of the DRAM cell after the final capacitor structure is completed.

DESCRIPTION OF THE PREFERRED EMBODIMENT

Figure 1:
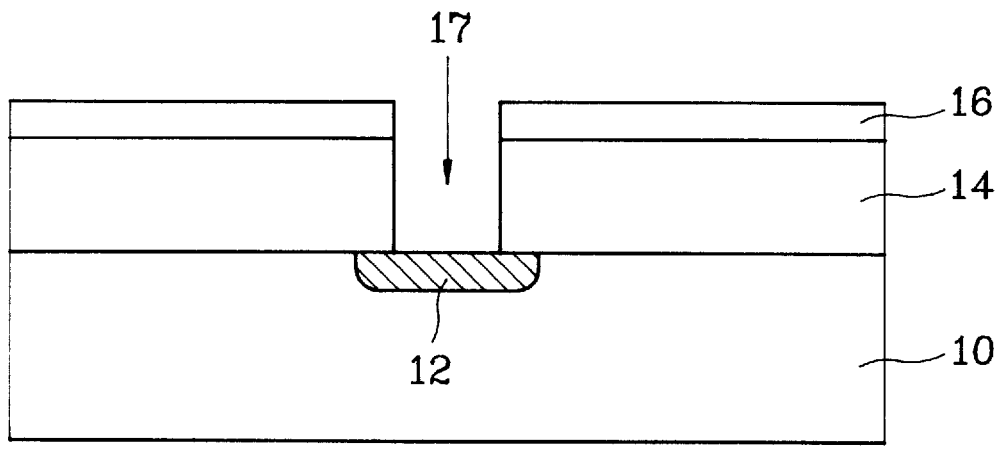
FIGS. 1 through 11 schematically illustrate the cross sectional view of a DRAM cell according to the present invention.

The invention discloses herein is directed to a method of fabricating the double-side corrugated cylindrical capacitor of high density DRAMs. The drawing figures are illustrated a partially completed integrated circuit device. In the following description, numerous details are set forth in order to provide a thorough understanding of the present invention. It will be appreciated by one skilled in the art that variations of these specific details are while still achieving the results of the present invention. In other instance, well-known processing steps are not described in detail in order not unnecessarily to obscure the present invention.

Referring now more particularly to FIG. 1, there is shown a portion of partially completed Metal-Oxide-Semiconductor Field Effect Transistor (MOSFET). A MOSFET region is usually consist of a gate oxide, gate electrode, pad oxide, lightly doped region, spacers, source and drain. For simplicity reason, FIG. 1 only shows the source region of a MOSFET which is fabricated on a P-type semiconductor silicon substrate 10. The source region 12 of the MOSFET which is formed by ion implantation technique, is preferably doped with arsenic ($As^{75}$) or phosphorus ($P^{31}$) ions, with an implantation dose of 2E15 to 5E16 $cm^{-2}$, and an implantation energy of 30 to 80 keV.

Referring to FIG. 1 again, the first dielectric 14 and second dielectric 16 layers are continuously deposited on the silicon substrate 10. The first dielectric layer 14 is usually using boronphosphosilicate glass (BPSG) which is formed by atmosphere CVD (APCVD) technique under the following condition: the temperature is about 400° C., and pressure is about 1.0 torr, with reactant gases of $Si(C_2H_5O)_4.N_2$ and TMB (Tri-Methyl-Borate). The thickness of the first dielectric layer 14 is about 3000 to 8000 Angstroms. Thereafter, the first dielectric layer 14 is planarized by thermal etchback or chemical mechanical polishing (CMP) techniques. The second dielectric layer 16 is usually using undoped silicon oxide which is formed by low pressure CVD (LPCVD) technique under the following condition: the temperature is about 720° C., and pressure is about 0.25 torr, with reactant gases of $Si(C_2H_5O)_4.N_2O$ and $O_2$. The thickness of the second dielectric layer 16 is about 500 to 1500 Angstroms.

Still referring to FIG. 1, the first dielectric and second dielectric layers are partially etched to open a cell contact window 17 for the source 12 of the MOSFET by conventional lithography and plasma-etching techniques. The plasma etching process can use magnetic enhanced reactive ion etching (MERIE), electron cyclotron etching (ECR) or reactive ion etching (RIE) methods with reactant gases such as $CF_4.CHF_3$ and Ar.

Figure 2:
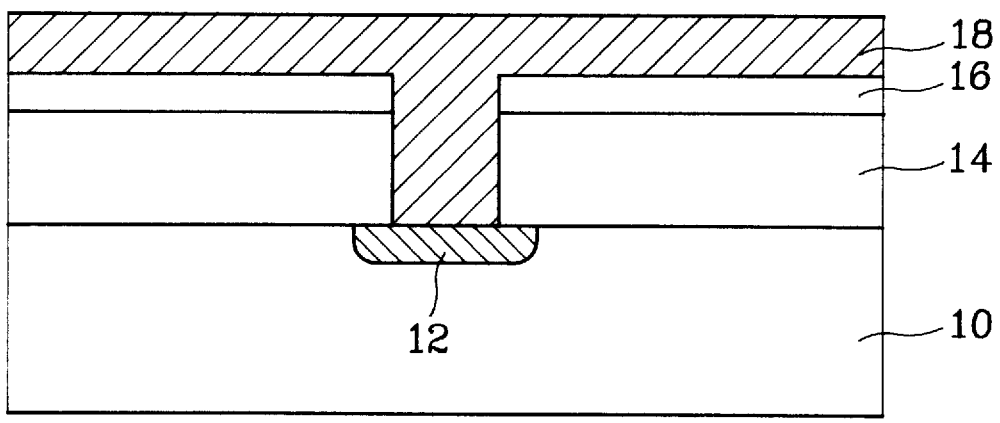

Referring now to FIG. 2, the first polysilicon layer 18 which is overlaying the second dielectric layer 16 and filling into the cell contact window 17 is deposited. The first polysilicon layer 18 is usually formed by in-situ phosphorus doped LPCVD method under a mixture of ($15\%PH_3+85\%SiH_4$) and ($5\%PH_3+95\%N_2$), at the temperature about 550° C. to obtain a thickness of between 1000 to 4000 Angstroms.

Figure 3:
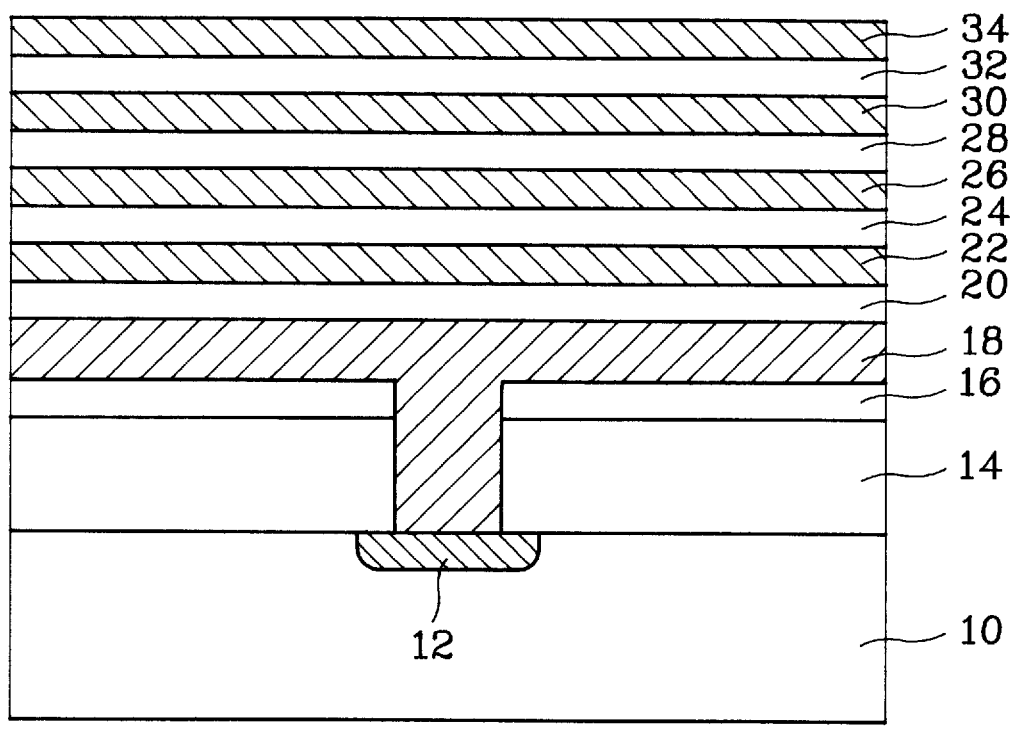
Figure 4:
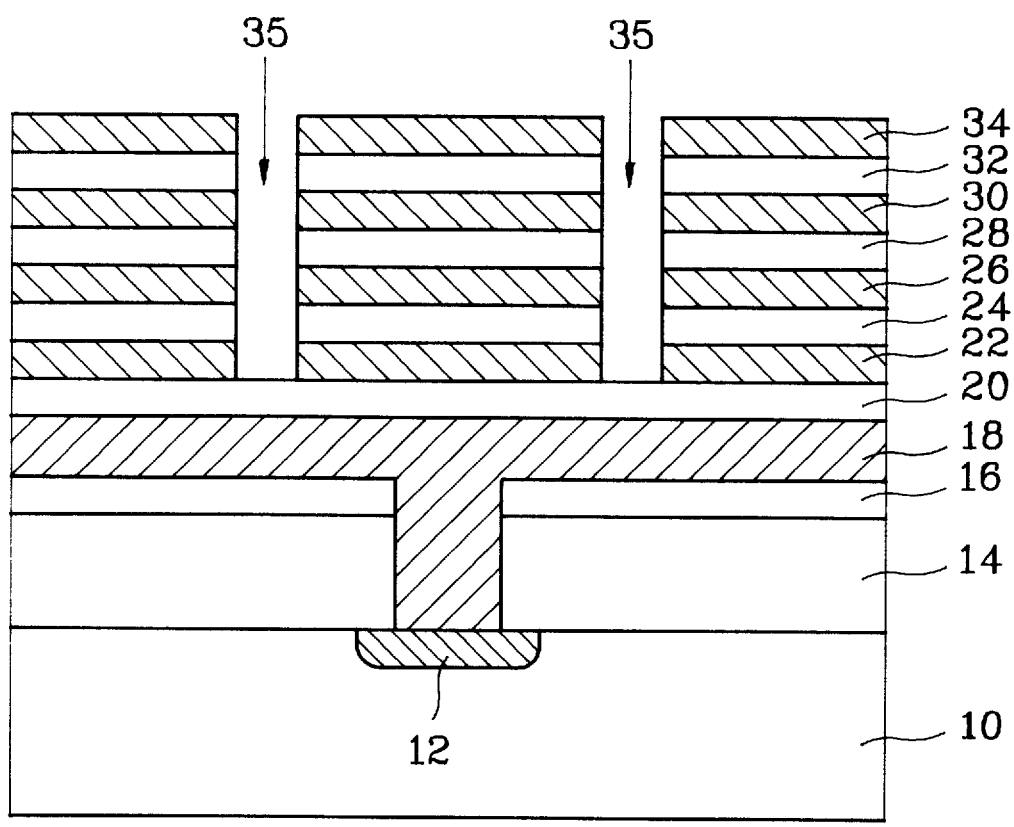

Referring now to FIG. 3, the third dielectric layer 20 is formed for etching stopper overlaying the first polysilicon layer 18. The third dielectric layer 20 is usually using nitride by LPCVD technique under the following conditions: the pressure is between 200 to 400 mTorr, with a temperature of about 720° C., and reactant gases $SiH_2Cl_2$ and $NH_3$ flowing. The third dielectric layer 20 has a thickness of 500 to 1500 Angstroms Referring to FIG. 3 again, the first thermal CVD oxide 22 and the first PECVD oxide 24 layers are formed overlaying the third dielectric layer 20. Then this step is repeated for several times to produce the second thermal CVD oxide 26, the second PECVD oxide 28, the third thermal CVD oxide 30, the third PECVD oxide 32, and the fourth thermal CVD oxide 34 alternating layers as shown in FIG. 4. The thickness of each oxide layer is about 200 to 400 Angstroms. The thermal CVD oxide process uses a gas stream of $SiH_2Cl_2$ and $N_2O$ or $SiH_4$ and $O_2$, at a fairly high temperature in the range of 750° to 900° C. The PECVD oxide is generally deposited under a power of 200 to 800 Watts, and in the temperature range of 300° to 400° C., with a gas stream of $SiH_4$ and $O_2$. Alternatively, the thermal CVD oxide can be replaced by either atmosphere CVD (APCVD) or sub atmosphere CVD (SA CVD) oxides.

Referring now to FIG. 4, the thermal CVD oxide and the plasma-PECVD oxide alternating layers are vertically etched to form two parallel trenches 35 by the conventional lithography and plasma-etching techniques. The plasma-etching is stopped by the third dielectric layer 20 without damaging the first polysilicon layer 18. The oxide plasma-etching process can also use MERIE method with reactant gases such as $CF_4$, $CHF_3$ and Ar.

Figure 5:
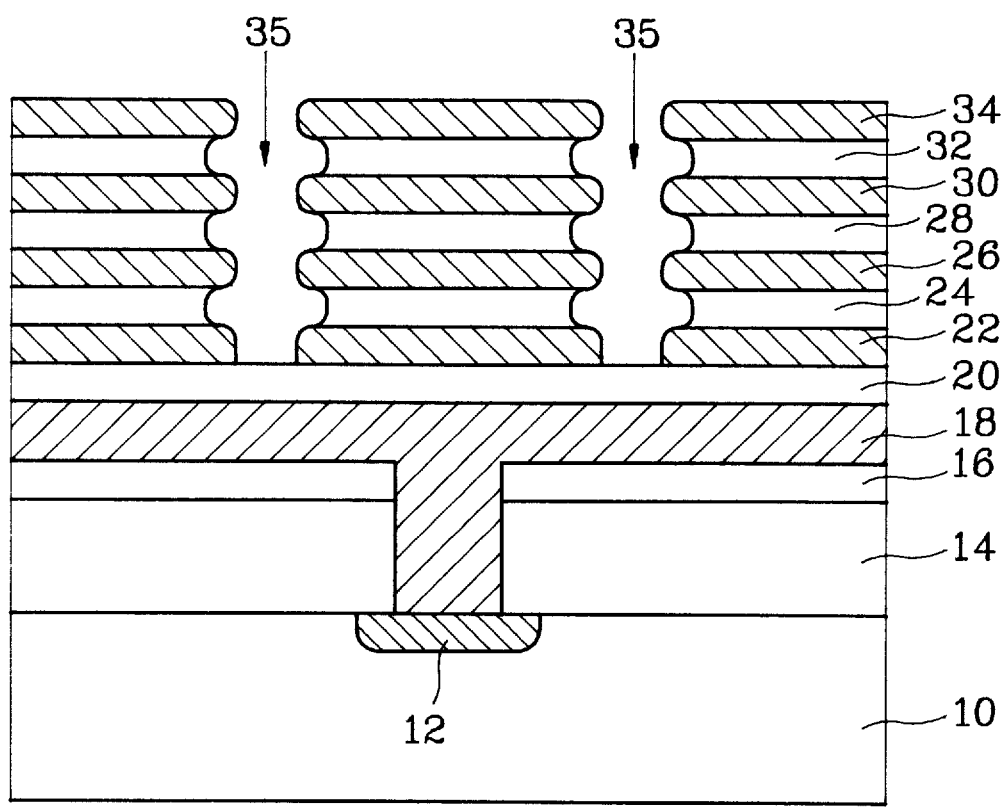

Referring now to FIG. 5, the thermal CVD oxide and the PECVD oxide alternating layers in the trenches 35 are laterally etched by hydrofluoric acid (HF). Because hydrofluoric acid (HF) etches the thermal CVD oxide at a slower rate than etches the PECVD oxide, a cavity 35 is formed in each PECVD oxide layer along the trenches 35 as shown in FIG. 5. The PECVD oxide and the thermal CVD oxide have an HF etching rate ratio at least 4:1 and can be as high as 15:1 which is depended on the PECVD oxide deposition parameters such as temperature, pressure or power. An HF concentration of about 0.5 to 20% is used in this embodiment. Therefore, the double-side corrugated shape capacitor surface is created.

Figure 6:
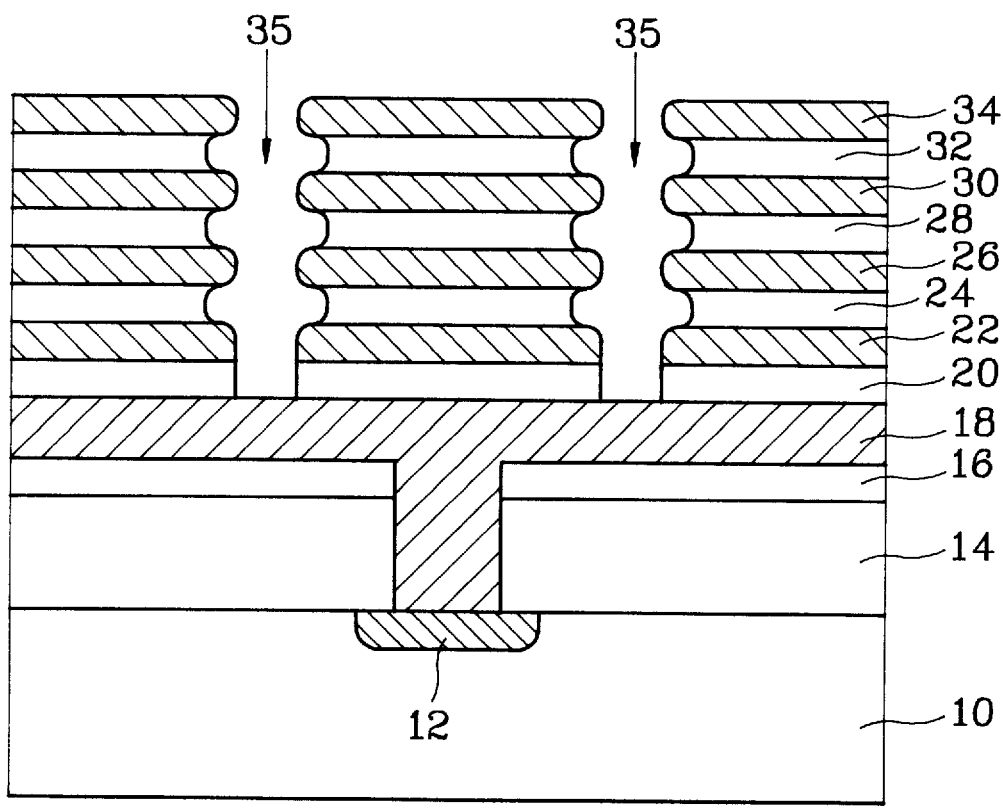

Referring now to FIG. 6, the third dielectric layer 20 is then etched away to expose the first polysilicon layer 18 in the trenches 35 by plasma-etching technique. The nitride plasma-etching process can also use MERIE method with reactant gases such as $CF_4$, $CHF_3$ and $NF_3$.

Figure 7:
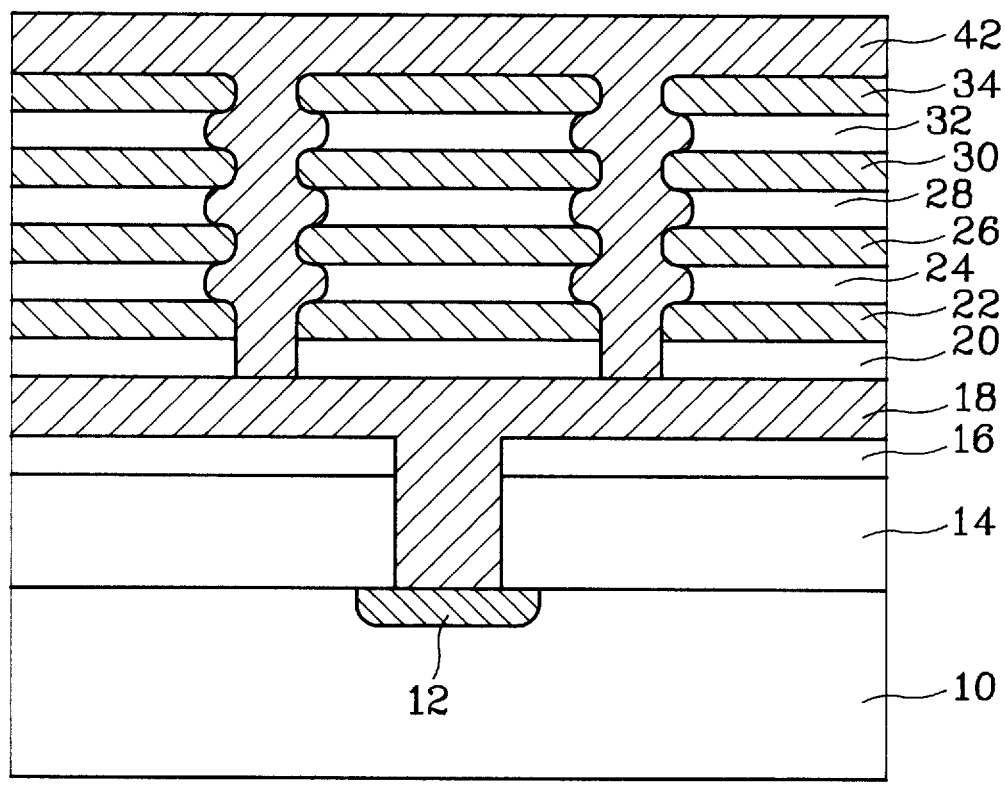

Referring now to FIG. 7, the second polysilicon layer 42 is deposited overlaying the alternating oxide layers and filling into the trenches. The second polysilicon layer 42 is also formed by in-situ phosphorus doped LPCVD method as first polysilicon layer 18. But the thickness of second polysilicon layer 42 is only about 1000 to 2500 Angstroms.

Figure 8:
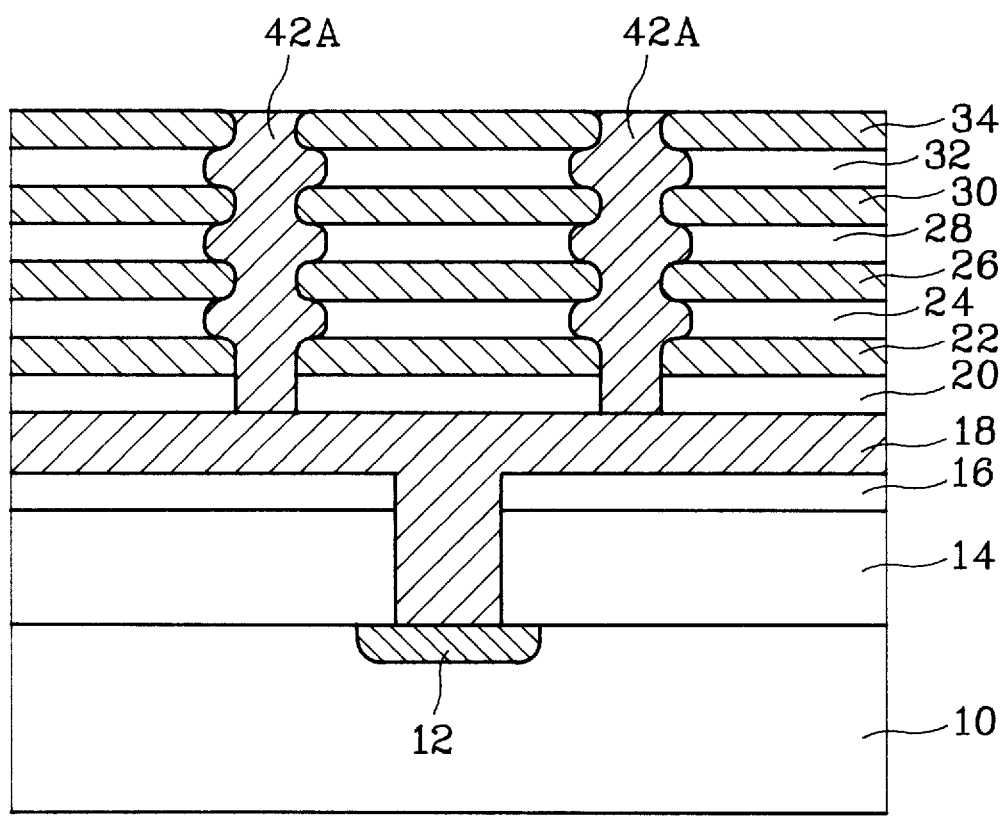

Referring now to FIG. 8, the second polysilicon layer 42 is then anisotropically etched to form the second polysilicon studs 42A which are located in the trenches 35. The plasma-etching process for the second polysilicon layer can still use MERIE method with reactant gases such as $Cl_2$, $SF_6$ and HBr.

Figure 9:
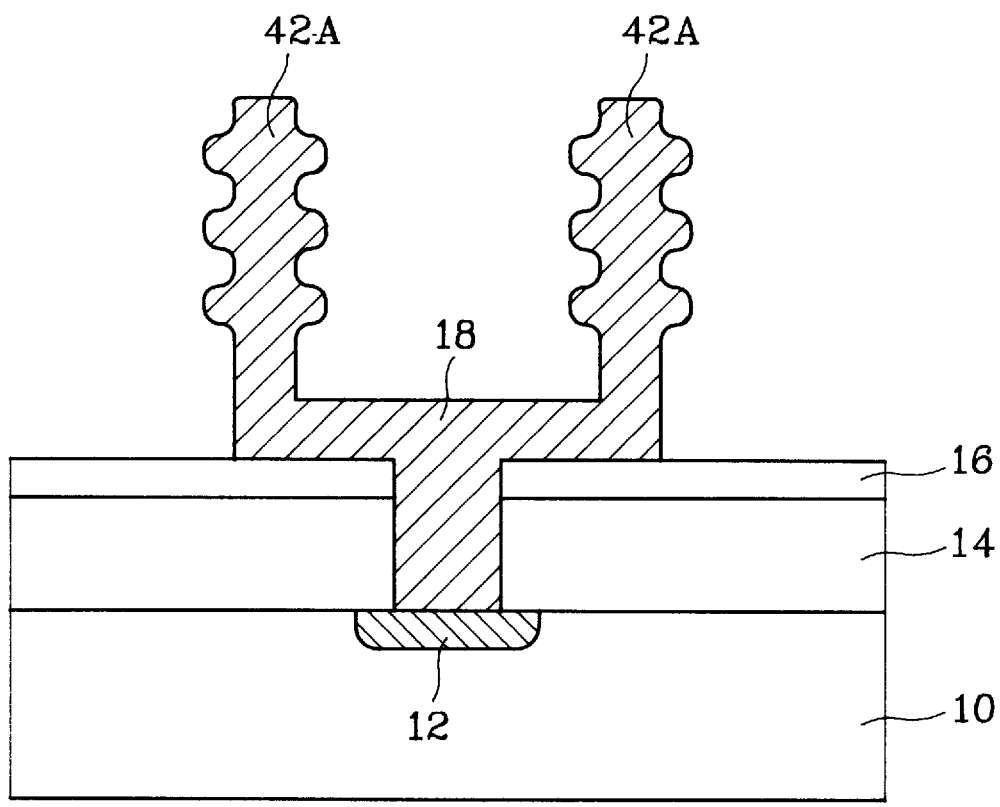

Referring now to FIG. 9, the thermal CVD oxide and the PECVD oxide alternating layers and the third dielectric layer 20 are removed by hydrofluoric acid solution or vapor, and is preferable using hydrofluoric vapor which is more effective. Thereafter, a portion of the first polysilicon layer 18 is also removed by plasma-etching technique which described before. The double-side corrugated storage node of the DRAM capacitor which is consist of the remaining first polysilicon layer 18 and the second polysilicon studs 42A is finally completed as shown in FIG. 9.

Figure 10:
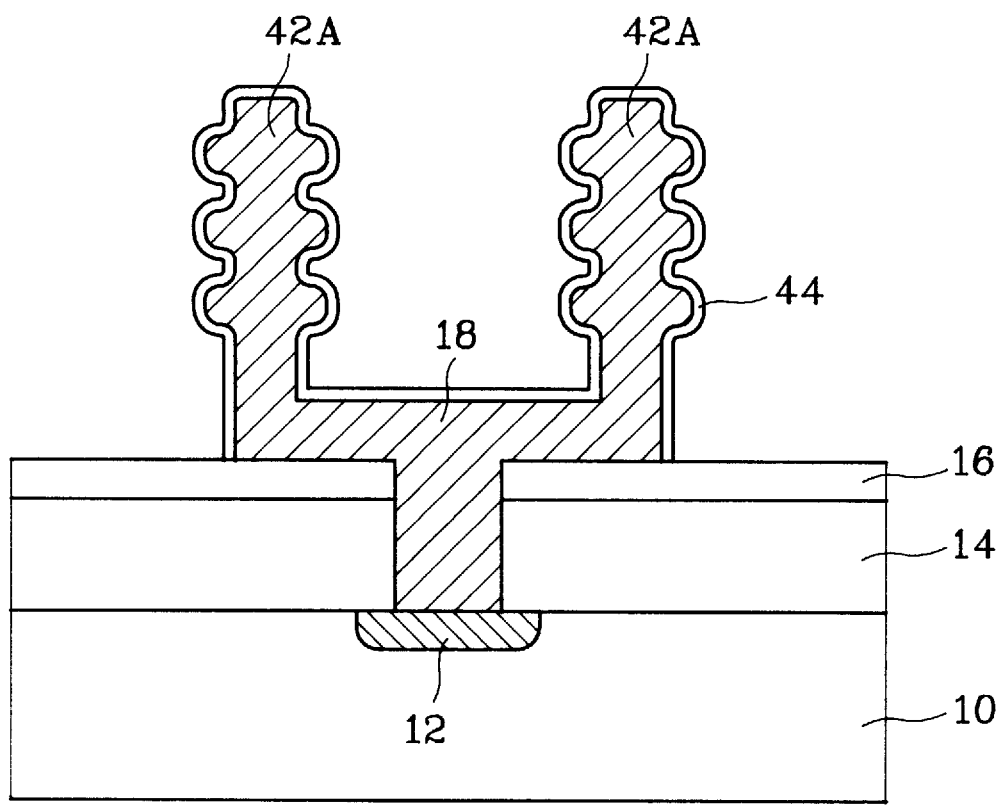

Referring now to FIG. 10, the dielectric layer 44 is formed by standard integrated circuit processing procedure. The capacitor dielectric layer 38 is usually using nitride/oxide (NO) doublelayer or oxide/nitride/oxide (ONO) triplelayer or even tantalum oxide ($Ta_2O_5$) material. The thickness of the capacitor dielectric layer 44 is about 20 to 100 Angstroms.

Figure 11:
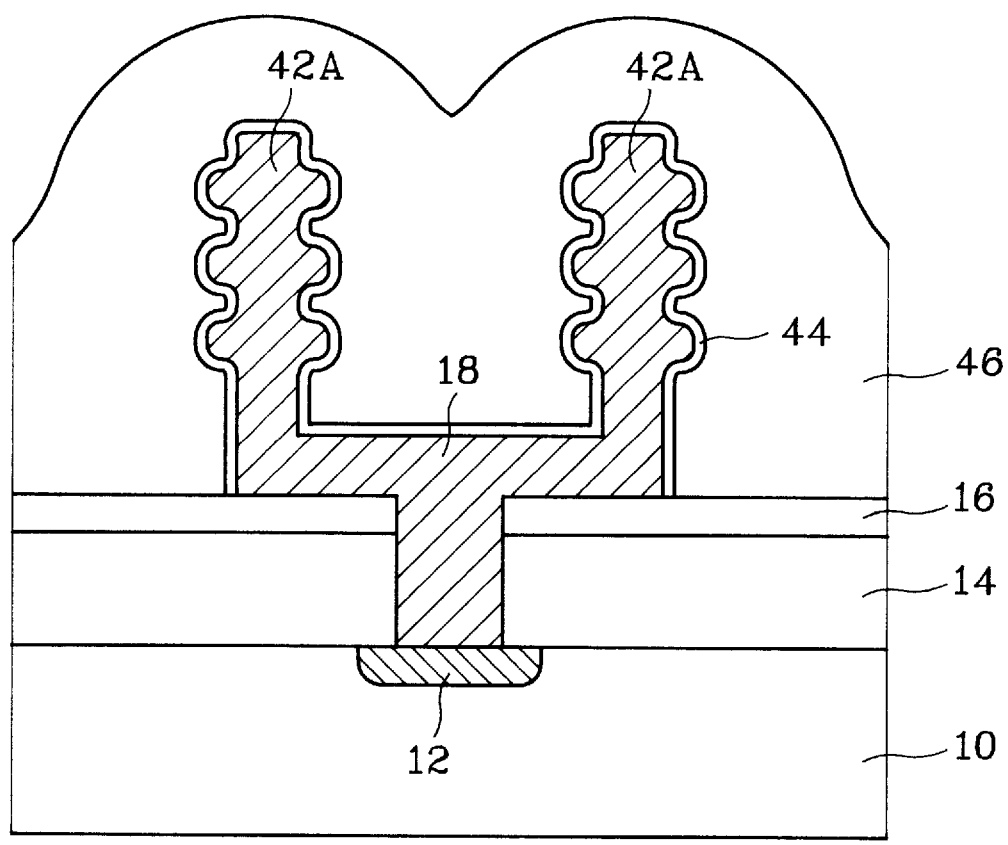

Referring now to FIG. 11, finally, the third polysilicon layer 46 is deposited overlaying the capacitor dielectric layer 44. The thickness of the third polysilicon layer 40 is about 1000 to 2000 Angstroms. The third polysilicon top electrode is then patterned by the conventional lithography and plasma-etching techniques.

The double-side corrugated cylindrical capacitor storage node of the present invention has much greater surface area so as to increase the capacitance value of the DRAM capacitor, that can achieve high packing density of the integrated circuit devices.

While the invention has been particularly shown and described with reference to a preferred embodiment, it will be understood by those skilled in the art that various changes in form and detail may be made therein without departing from the spirit and scope of the present invention.

What we claimed is:

1. A method of fabricating at least one capacitor of a DRAM cell, said method comprising the steps of:

(a) forming MOSFET structure on a silicon substrate, wherein said MOSFET structure comprises a gate oxide, gate electrode and drain/source regions;

(b) continuously forming a first dielectric and a second dielectric layers overlaying a surface of said silicon substrate;

(c) partially etching said first dielectric and said second dielectric layers to open a cell contact window for said source region of said MOSFET structure by conventional lithography and plasma-etching techniques;

(d) forming a first polysilicon layer overlaying said second dielectric layer and filling into said cell contact window;

(e) forming a third dielectric layer as etch stopping layer;

(f) alternately depositing first etch type oxide and second etch type oxide layers to form oxide alternating layers, said first etch type oxide layers etch slower than said second etch type oxide layers during a lateral etching;

(g) vertically etching said first etch type oxide and said second etch type oxide alternating layers to form two parallel trenches by the conventional lithography and plasma-etching techniques;

(h) laterally etching said first etch type oxide and said second etch type oxide alternating layers to form cavities therein said second etch type oxide layers;

(i) etching said third dielectric layer in said trenches to expose said first polysilicon layer;

(j) forming a second polysilicon layer overlaying said first polysilicon layer in said trenches and said oxide alternating layers;

(k) anisotropically etching said second polysilicon layer to form second polysilicon studs in said trenches;

(l) removing said oxide alternating layers, said third dielectric layer and a portion of said first polysilicon layer, a storage node of said capacitor which comprises the remaining said first polysilicon layer and said second polysilicon studs is constructed;

(m) forming a capacitor dielectric layer overlaying said storage node of the capacitor;

(n) forming a third polysilicon layer overlaying said capacitor dielectric layer; and (o) partially etching said third polysilicon layer and said capacitor dielectric layer to form a top electrode of the capacitor.

2. The method of claim 1, wherein said first dielectric layer is made of oxide which has a thickness of 3000 to 8000 Angstroms.

3. The method of claim 1, wherein said second dielectric layer is made of oxide which has a thickness of 500 to 1500 Angstroms.

4. The method of claim 1, wherein said first polysilicon layer is formed which has a thickness of 1000 to 4000 Angstroms by LPCVD technique.

5. The method of claim 1, wherein said third dielectric layer is made of nitride which has a thickness of 500 to 1500 Angstroms.

6. The method of claim 1, wherein said first etch type oxide layer is made of thermal CVD oxide, which has a thickness of 200 to 400 Angstroms.

7. The method of claim 1, wherein said first etch type oxide layer is made of atmosphere CVD (APCVD) oxide, which has a thickness of 200 to 400 Angstroms.

8. The method of claim 1, wherein said first etch type oxide layer is made of sub atmosphere CVD (SACVD) oxide, which has a thickness of 200 to 400 Angstroms.

9. The method of claim 1, wherein said second etch type oxide layer is made of plasma enhanced CVD (PECVD) oxide, which has a thickness of 200 to 400 Angstroms.

10. The method of claim 1, wherein said laterally etching is performed by hydrofluoric acid (HF) whose concentration is between 0.5% and 20%.

11. The method of claim 1, wherein said capacitor dielectric layer is selected from the group comprising of nitride/oxide (NO) doublelayer, oxide/nitride/oxide (ONO) triplelayer and tantalum oxide ($Ta_2O_5$), which has a thickness of 20 to 100 Angstroms.

12. The method of claim 1, wherein said third polysilicon layer has a thickness of 1000 to 2000 Angstroms.

13. A method of forming polysilicon capacitor structure, said method comprising the steps of:

(a) forming a first polysilicon layer a surface of a silicon substrate;

(b) forming a dielectric layer as etch stopping layer;

(c) alternately depositing first etch type oxide and second etch type oxide layers to form oxide alternating layers, said first etch type oxide layers etch slower than said second etch type oxide layers during the lateral etching;

(d) vertically etching said first etch type oxide and said second etch type oxide alternating layers to form two parallel trenches by conventional lithography and plasma-etching techniques;

(e) laterally etching said first etch type oxide and said second etch type oxide alternating layers to form cavities therein said second etch type oxide layers;

(f) etching said dielectric layer in said trenches to expose said first polysilicon layer;

(g) forming a second polysilicon layer overlaying said first polysilicon layer in said trenches and said oxide alternating layers;

(h) anisotropically etching said second polysilicon layer to form second polysilicon studs in said trenches;

(i) removing said oxide alternating layers, said dielectric layer and a portion of said first polysilicon layer, a storage node of said capacitor structure which comprises the remaining said first polysilicon layer and said second polysilicon studs is constructed;

(j) forming a capacitor dielectric layer overlaying said storage node of the capacitor structure;

(k) forming a third polysilicon layer overlaying said capacitor dielectric layer; and (l) partially etching said third polysilicon layer and said capacitor dielectric layer to form a top electrode of the capacitor structure.

14. The method of claim 13, wherein said first polysilicon layer is formed which has a thickness of 1000 to 4000 Angstroms by LPCVD technique.

15. The method of claim 13, wherein said dielectric layer is nitride which has a thickness of 500 to 1500 Angstroms.

16. The method of claim 13, wherein said first etch type oxide layer is made of thermal CVD oxide, which has a thickness of 200 to 400 Angstroms.

17. The method of claim 13, wherein said first etch type oxide layer is made of atmosphere CVD (APCVD) oxide, which has a thickness of 200 to 400 Angstroms.

18. The method of claim 13, wherein said first etch type oxide layer is made of sub atmosphere CVD (SACVD) oxide, which has a thickness of 200 to 400 Angstroms.

19. The method of claim 13, wherein said second etch type oxide layer is made of plasma enhanced CVD (PECVD) oxide, which has a thickness of 200 to 400 Angstroms.

20. The method of claim 13, wherein said laterally etching is performed by hydrofluoric acid (HF) whose concentration is between 0.5% and 20%.

21. The method of claim 13, wherein said capacitor dielectric layer is selected from the group comprising of nitride/oxide (NO) doublelayer, oxide/nitride/oxide (ONO) triplelayer and tantalum oxide ($Ta_2O_5$), which has a thickness of 20 to 100 Angstroms.

22. The method of claim 13, wherein said third polysilicon layer has a thickness of 1000 to 2000 Angstroms.

* * * * *